(12) United States Patent
Dai et al.

(10) Patent No.: US 11,569,801 B2
(45) Date of Patent: Jan. 31, 2023

(54) ANALOG-TO-DIGITAL CONVERTER, PHASE SAMPLER, TIME-TO-DIGITAL CONVERTER, AND FLIP-FLOP

(71) Applicant: QUALCOMM INCORPORATED, San Diego, CA (US)

(72) Inventors: Liang Dai, San Diego, CA (US); Kentaro Yamamoto, San Diego, CA (US); Behnam Sedighi, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/198,515

(22) Filed: Mar. 11, 2021

(65) Prior Publication Data

US 2022/0294433 A1    Sep. 15, 2022

(51) Int. Cl.
   *H03M 1/00*      (2006.01)
   *H03K 3/356*     (2006.01)
   *H03M 3/00*      (2006.01)

(52) U.S. Cl.
   CPC ...... *H03K 3/356043* (2013.01); *H03M 3/436* (2013.01); *H03M 3/458* (2013.01)

(58) Field of Classification Search
   CPC .................. H03K 3/356043; H03M 3/436; H03M 3/458; H03M 1/12
   See application file for complete search history.

(56) References Cited

U.S. PATENT DOCUMENTS

| | | | |
|---|---|---|---|
| 5,453,708 A | 9/1995 | Gupta et al. | |
| 10,044,365 B1 * | 8/2018 | Dai | H03M 3/452 |
| 10,164,653 B1 * | 12/2018 | Kinyua | H03M 1/16 |
| 2005/0122239 A1 * | 6/2005 | Walker | H03M 5/04 |
| | | | 341/56 |

(Continued)

FOREIGN PATENT DOCUMENTS

TW        201401782 A       1/2014

OTHER PUBLICATIONS

Kim L-S., et al., "Metastability of CMOS Latch/Flip-Flop", IEEE Journal of Solid-State Circuits, IEEE, USA, vol. 25, No. 4, Aug. 1, 1990 (Aug. 1, 1990), pp. 942-951, XP000149243, ISSN: 0018-9200, DOI: 10.1109/4.58286, figures 6-9.

(Continued)

*Primary Examiner* — Jean B Jeanglaude
(74) *Attorney, Agent, or Firm* — Smith Tempel Blaha LLC/Qualcomm

(57) ABSTRACT

A D-type flip-flop (DFF) includes an input circuit having a plurality of transistors configured to receive a clock signal and a data signal, a first inverter (INV1) having a pair of transistors, the first inverter configured to receive an input voltage (x) from the input circuit at a first inverter input, the first inverter configured to provide an output voltage (y) to a first inverter output, a second inverter (INV2) coupled to the first inverter (INV1), the second inverter having a second inverter input and a second inverter output, the second inverter input coupled to the first inverter output, a third inverter (INV3) coupled to the second inverter (INV2), the third inverter having a third inverter input and a third inverter output, and a current device coupled to the first inverter output, the current device configured to provide a current at the first inverter output.

20 Claims, 14 Drawing Sheets

(56) References Cited

U.S. PATENT DOCUMENTS

| | | | |
|---|---|---|---|
| 2006/0017596 A1* | 1/2006 | Ido | H03M 1/0863 341/144 |
| 2006/0158362 A1* | 7/2006 | Shimizu | H03M 1/0675 341/144 |
| 2008/0007367 A1* | 1/2008 | Kim | H03B 5/04 331/36 C |
| 2008/0290955 A1* | 11/2008 | Fort | H03K 3/0231 331/111 |
| 2013/0321189 A1* | 12/2013 | Yoshioka | H03M 1/145 341/156 |
| 2020/0143851 A1 | 5/2020 | Holm | |

OTHER PUBLICATIONS

Partial International Search Report—PCT/US2022/017218—ISA/EPO—dated Jun. 10, 2022.

Udaiyakumar R., et al., "Self Clock-Gating Scheme for Low Power Basic Logic Element Architecture", Wireless Personal Communications, vol. 102, No. 4, Feb. 22, 2018 (Feb. 22, 2018), pp. 3477-3488, XP055924094, NL, ISSN: 0929-6212, DOI: 10.1007/s11277-018-5385-2, Retrieved from the Internet: URL: https://link.springer.com/content/pdf/10.1007/s11277-018-5385-2.pdf [retrieved on May 23, 2022] figure 4.

Dhanaasekaran V., et al., "A Continuous Time Multi-Bit $\Delta\Sigma$ ADC Using TIme Domain Quantizer and Feedback Element", IEEE Journal of Solid-State Circuits, vol. 46, No. 3, Mar. 1, 2011 (Mar. 1, 2011), pp. 639-650, XP055482051, USA ISSN: 0018-9200, DOI: 10.1109/JSSC.2010.2099893, figures 1-5, 12.

Elsayed M.M., et al., "A 0.8 PS DNL Time-to-Digital Converter With 250 MHz Event Rate in 65 nm CMOS for Time-Mode-Based $\Sigma\Delta$ Modulator", IEEE Journal of Solid-State Circuits, IEEE, USA, vol. 46, No. 9, Sep. 1, 2011 (Sep. 1, 2011), pp. 2084-2098, XP011381457, ISSN: 0018-9200, DOI: 10.1109/JSSC.2011.2156990 p. 2087, figures 3-5,11.

International Search Report and Written Opinion—PCT/US2022/017218—ISA/EPO—dated Sep. 20, 2022.

* cited by examiner

ANALOG-TO-DIGITAL CONVERTER, PHASE SAMPLER, TIME-TO-DIGITAL CONVERTER, AND FLIP-FLOP

FIELD

The present disclosure relates generally to electronics, and more specifically to radio frequency (RF) transmitters and receivers.

BACKGROUND

Wireless communication devices and technologies are becoming ever more prevalent. Wireless communication devices generally transmit and receive communication signals. A communication signal is typically processed by a variety of different components and circuits. One of the circuits that process a communication signal is an analog-to-digital converter (ADC). As the name implies, an ADC is a circuit that converts a signal from the analog domain to the digital domain. One type of ADC is referred to as a delta-sigma ADC.

In a conventional ADC, an analog signal is sampled with a sampling frequency and subsequently quantized in a quantizer into a digital signal. This process introduces noise due to quantization error. In delta-sigma modulation, accuracy of the quantization is improved by passing the digital output through a digital-to-analog converter (DAC) and subtracting the resulting analog signal from the input signal (delta). The residual signal is subsequently processed by one or more integrator stages (sigma) before being quantized by the quantizer.

An ADC may employ what is referred to as a time-to-digital converter (TDC) to quantize the sampled analog signal. A TDC may use D-type flip-flops (DFF) as phase samplers. In a high-speed ADC, where the clock pulses are quite closely spaced, a phase sampler may become metastable. Metastability is a condition where a logic gate (for example, a register) in the quantizer may not settle to a defined value (for example, a logic zero (0) or a logic one (1)) in sufficient time to avoid timing violations, resulting in a condition where the output may be indeterminate. A fast phase sampler is desirable to avoid metastability.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a D-type flip-flop (DFF) including an input circuit having a plurality of transistors configured to receive a clock signal and a data signal, a first inverter (INV1) having a pair of transistors, the first inverter configured to receive an input voltage (x) from the input circuit at a first inverter input, the first inverter configured to provide an output voltage (y) to a first inverter output, a second inverter (INV2) coupled to the first inverter (INV1), the second inverter having a second inverter input and a second inverter output, the second inverter input coupled to the first inverter output, a third inverter (INV3) coupled to the second inverter (INV2), the third inverter having a third inverter input and a third inverter output, and a current device coupled to the first inverter output, the current device configured to provide a current at the first inverter output.

Another aspect of the disclosure provides a method for operating a D-type flip-flop (DFF) including receiving an input voltage (x) at a first inverter input and generating an output voltage (y) at a first inverter output, beginning voltage transition of the input voltage (x) and the output voltage (y) to opposite logic states, and increasing a rate of the voltage transition of the input voltage (x) and the output voltage (y).

Another aspect of the disclosure provides a device including means for means for receiving an input voltage (x) at a first inverter input and generating an output voltage (y) at a first inverter output, means for beginning voltage transition of the input voltage (x) and the output voltage (y) to opposite logic states, and means for increasing a rate of the voltage transition of the input voltage (x) and the output voltage (y).

Another aspect of the disclosure provides an analog-to-digital converter (ADC) including a loop filter configured to receive an input signal and provide an output signal, a quantizer coupled to the loop filter, the quantizer configured to receive an output of the loop filter and provide an output signal, a digital-to-analog converter (DAC) configured to receive an output of the quantizer and provide an output to the loop filter, the quantizer comprising a zero crossing detector (ZCD) and a time-to-digital converter (TDC), the time-to-digital converter (TDC) comprising a plurality of D-type flip-flops, each D-type flip-flop configured to receive a data signal and a clock signal, each D-type flip-flop including an input circuit having a plurality of transistors configured to receive a clock signal and a data signal, the input circuit coupled to a first node and configured to output a first signal at the first node, a plurality of inverters, wherein an input of a first inverter of the plurality of inverters is coupled to the first node, and a transistor, the transistor having a source and a drain, the source coupled to a reference voltage, the drain coupled to a second node, the second node coupling an output of the first inverter to an input of a second inverter of the plurality of inverters.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In a modern wireless communication device, a high-speed analog-to-digital converter (ADC) is used to process the communication signals. A high-speed ADC typically uses D-type flop-flops (DFF) as its register elements. The clock inputs to a DFF are typically complementary signals, CLK and CLKB. The data inputs to a DFF are also typically complementary signals, ZC and ZCB. The nomenclature "ZC" refers to zero crossing, that is, when the data signal crosses zero volts, and the nomenclature "ZCB" refers to the data signal complement of the ZC signal. Metastability may occur when the complement of the data signal (ZCB) transitions from logic high (a one (1)) to logic low (a zero (0)) at the same time the clock signal, CLK, transitions from logic low to logic high; and may also occur when the data signal (ZC) transitions from logic low (a zero (0)) to logic high (a one (1)) at the same time that the clock signal, CLK, transitions from logic low to logic high. When an input voltage and output voltage of an inverter in the DFF approach VDD/2, the DFF may become metastable. The input voltage and output voltage of the inverter in the DFF may also diverge exponentially with a time constant, $\tau_{10}$. The value of $\tau_{10}$ is approximately proportional to gm/C, where gm is the total transconductance of the transistors that comprise the inverters in the DFF, and C is a combination of capacitances at the input and output of the inverter. The value $\tau_{10}$ can be defined as the time it takes the differential voltages at the input and the output of an inverter in a DFF to change by a factor of ten (10). Reducing the time, $\tau_{10}$, reduces the likelihood that the DFF will become metastable for a sufficiently long period of time to corrupt the output of the DFF.

Exemplary embodiments of the disclosure are directed to a flip-flop circuit. For example, the flip-flop circuit may be implemented as a D-type flip-flop (DFF) and/or may be included in an ADC, such as in a TDC of the ADC. In some embodiments, an ADC having a phase sampler uses a TDC that includes a DFF-based quantizer in which the speed at which the DFF in the TDC switches between logic high and logic low (or logic low and logic high) is increased so as to avoid the likelihood that the DFF in the TDC enters a metastable condition.

Figure 1:
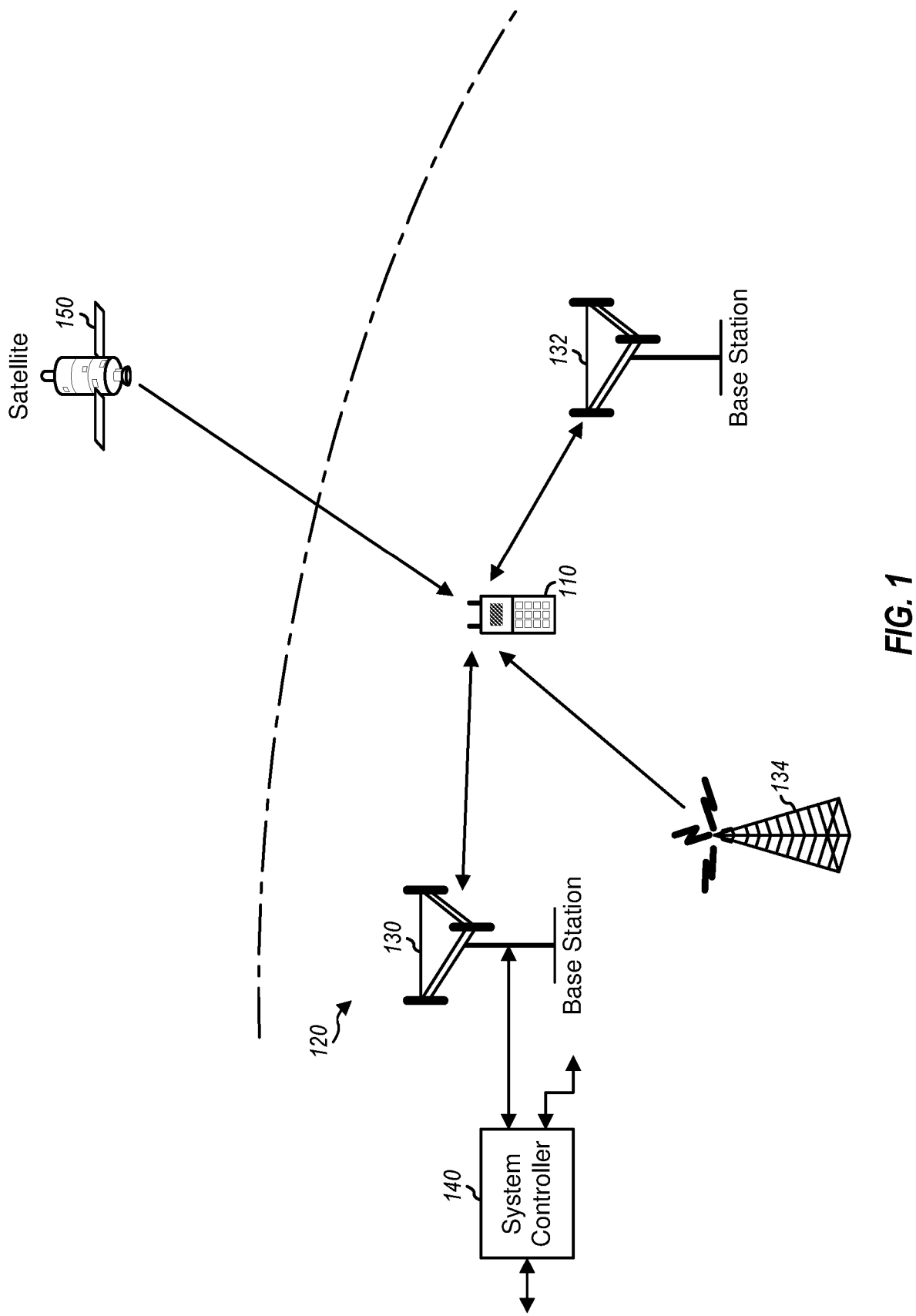
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
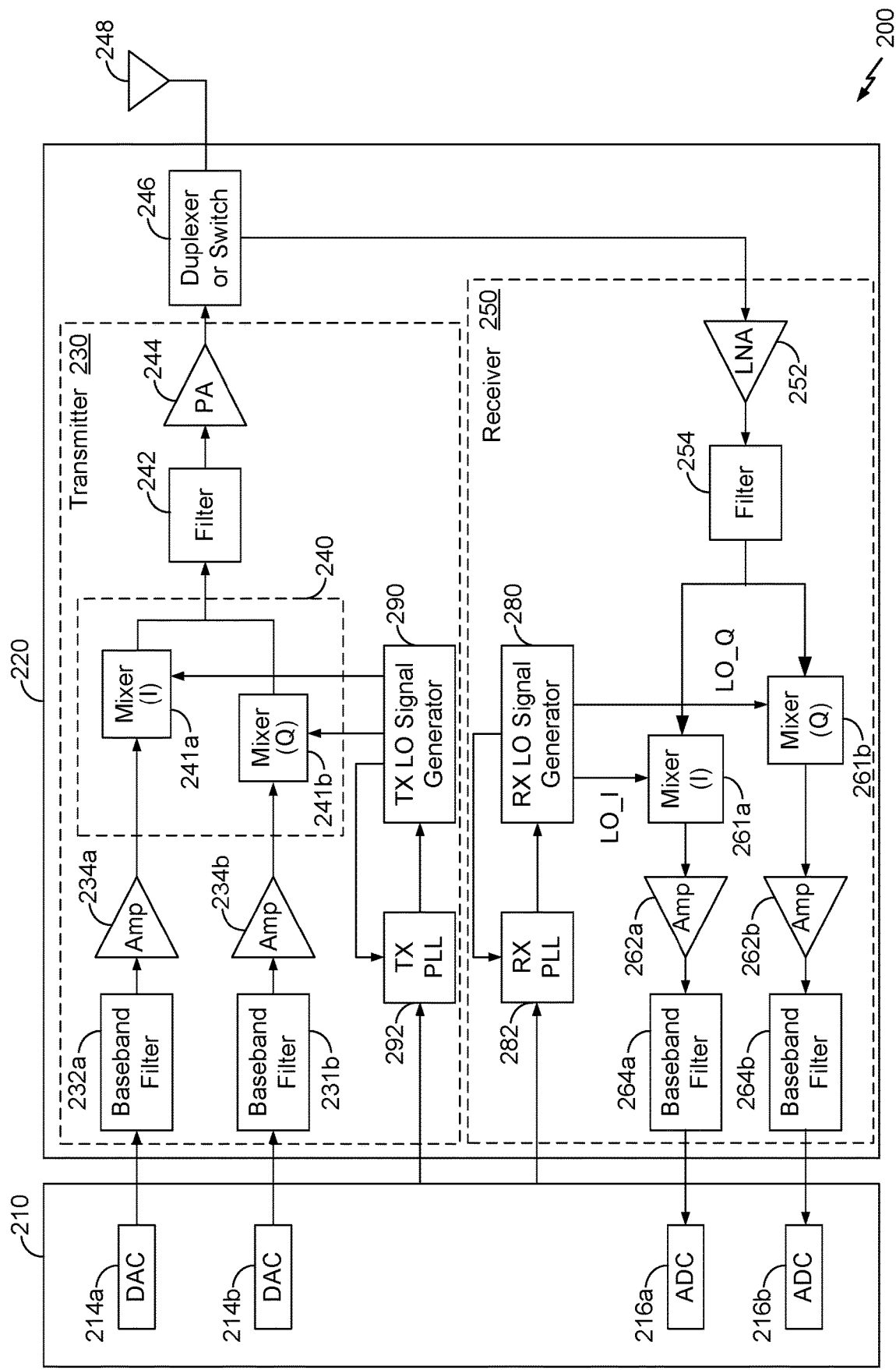
FIG. 2 is a block diagram showing a wireless device in which the exemplary techniques of the present disclosure may be implemented.

FIG. 2 is a block diagram showing a wireless device 200 in which the exemplary techniques of the present disclosure may be implemented. The wireless device 200 may, for example, be an embodiment of the wireless device 110 illustrated in FIG. 1.

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a memory (not shown) to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240, for example including upconversion mixers 241a and 241b, upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally. In an exemplary embodiment, the phase sampler for a TDC as described herein may be implemented in one or more of the ADC 216a and ADC 216b in FIG. 2, or in another ADC in the wireless communication device 200. In addition, the phase sampler for a TDC as described herein may be implemented using one or more flip-flops as described herein.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels.

Figure 3:
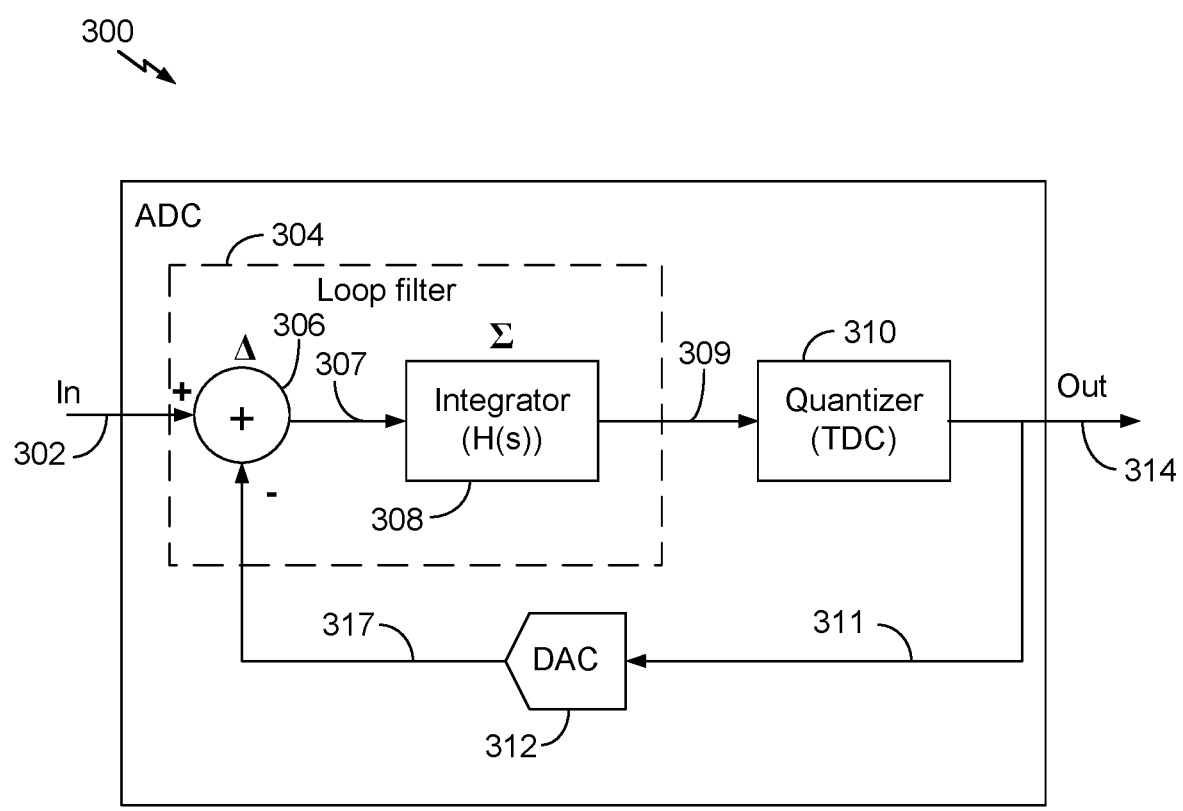
FIG. 3 is a block diagram of an exemplary analog-to-digital converter (ADC).

FIG. 3 is a block diagram of an exemplary ADC. The ADC shown in FIG. 3 may be a high-speed ADC in a portable communication device. For example, the ADC illustrated in FIG. 3 may be used to implement the ADC 216a and/or 216b in the wireless device 200 (FIG. 2). However, the ADC may be located elsewhere in the wireless device or in another electronic device. In an exemplary embodiment, the ADC 300 may be a so-called sigma-delta ADC. In an exemplary embodiment, the ADC 300 may comprise a loop filter 304, a quantizer 310 and a digital-to-analog converter (DAC) 312. The loop filter 304 may comprise an adder 306 (e.g., the "delta" function) and an integrator 308 (e.g., the "sigma" function).

An analog input signal may be applied over connection 302 to the adder 306. The adder combines (e.g., differences) an output of the DAC 312 on connection 317 with the input signal on connection 302. The DAC may be a one-bit DAC or a multi-bit DAC. The output of the adder 306 is provided over connection 307 to the integrator 308, which integrates (adds) the value of the signal on connection 307 with a previous value stored in the integrator 308. The output of the integrator 308 is provided over connection 309 to the quantizer 310.

The quantizer 310 samples the signal on connection 309 and provides a digitized output over connection 314. The digitized output on connection 314 is also provided as feedback to the DAC 312, which converts the signal on connection 311 to an analog value, which is provided over connection 317 to the adder 306 to be subtracted from the input signal on connection 302 as mentioned above.

Figure 4:
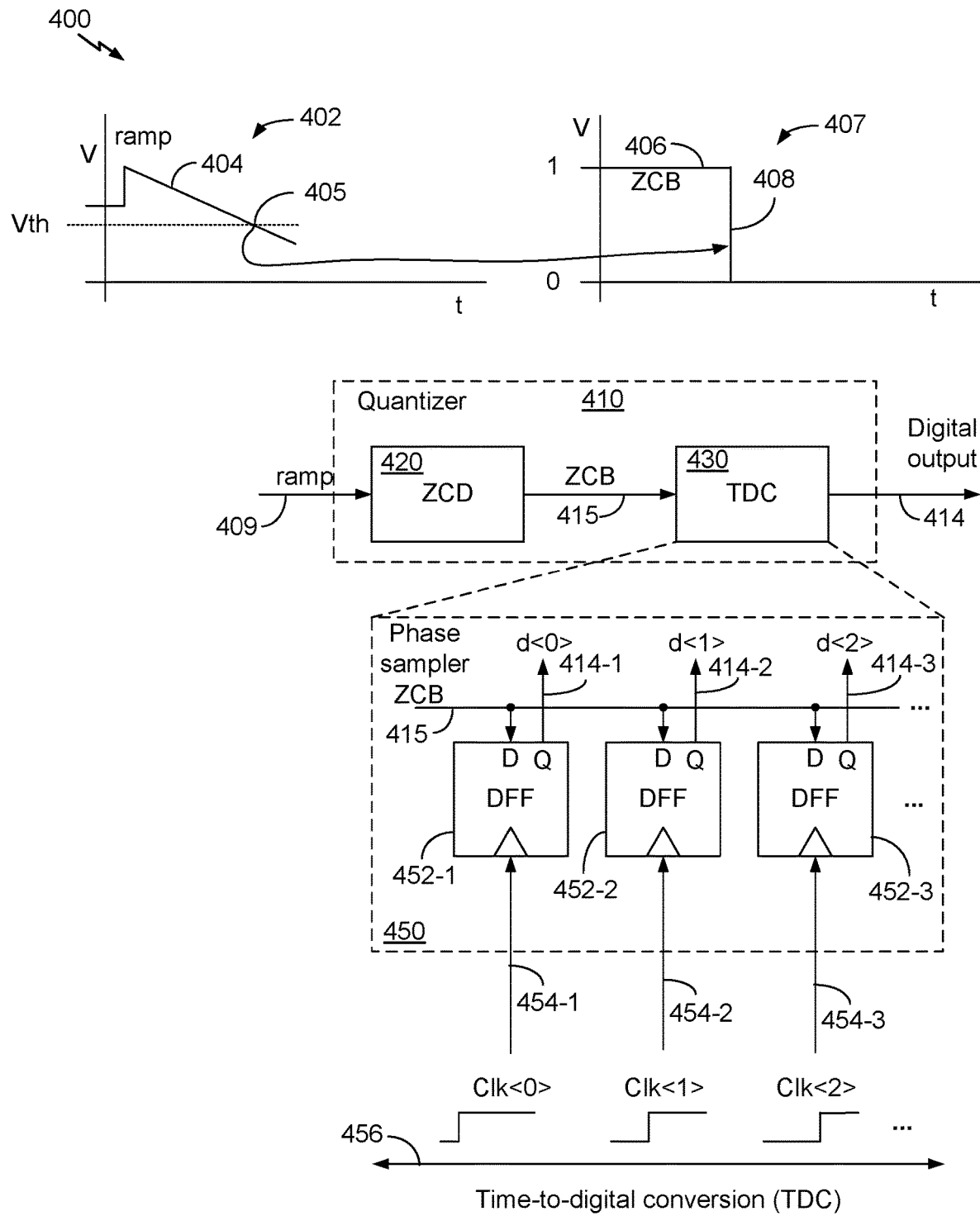
FIG. 4 is a block diagram of an exemplary embodiment of a quantizer of the ADC of FIG. 3.

FIG. 4 is a block diagram of an exemplary embodiment of a quantizer 310 of FIG. 3. In an exemplary embodiment, a quantizer 410 comprises a zero crossing detector (ZCD) 420 and a time-to-digital converter (TDC) 430. A ramp signal is provided to the ZCD 420 over connection 409. The connection 409 is similar to the connection 309 of FIG. 3 and may contain the output of the integrator 308. A signal 404 depicted as having a ramp function is shown on the graph 402. The graph 402 has a vertical axis showing voltage (v) and a horizontal axis showing time (t). A threshold voltage, Vth, is shown along the vertical axis. In an exemplary embodiment, the ramp signal 404 begins at a voltage higher than the threshold voltage, Vth, and decreases over time until it crosses the threshold voltage, Vth, at point 405. In an exemplary embodiment, the ramp signal 404 may be a decreasing voltage signal corresponding to an input signal, such as a data signal (ZCB), that may be transitioning from a logic high state to a logic low state. The segment 406 on the graph 407 corresponds to the signal 404 before it reaches time point 405 on the graph 402. The time point 405 on graph 402 corresponds to time point 408 on the graph 407, which shows a data signal, ZCB, 406 that has transitioned from a logic high state to a logic low state at the time 408. The zero crossing detector (ZCD) 420 is configured to detect when the ramp signal 404 crosses the time point 405, which corresponds to the time point 408 on the graph 407. In an exemplary embodiment, the ZCB signal (complement of the data signal, ZC) appears on connection 415 after time 408, and forms the input to the TDC 430.

In an exemplary embodiment, the TDC 430 comprises a phase sampler 450 that comprises a plurality of D-type flip-flops (DFF) 452-1, 452-2, and 452-3. However, although three DFFs are shown, the phase sampler 450 may have more or fewer DFFs. The ZCB signal is shown as occurring on connection 415 and being supplied as input to the "D" input of each of the DFFs 452-1, 452-2, and 452-3. Corresponding "Q" outputs 414-1, 414-2, and 414-3 are shown as being provided by respective DFFs 452-1, 452-2, and 452-3.

A clock signal is provided to a clock input of each DFF. In an exemplary embodiment, respective clock inputs 454-1, 454-2 and 454-3 are provided to respective DFFs 452-1, 452-2, and 452-3. In an exemplary embodiment, a clock signal may be provided by the data processor 210 of FIG. 2.

A time-to-digital conversion (TDC) timeline 456 is shown having three exemplary clock input signals Clk<0>, Clk<1> and Clk<2>, being provided to respective DFFs 452-1, 452-2, and 452-3. Each successive clock input is delayed by one clock pulse from a prior clock input. In an exemplary embodiment, the clock input signals Clk<0>, Clk<1> and Clk<2> can be generated by a delay locked loop (DLL) (not shown) or another element that generates a clock signal. The clock input signals Clk<0>, Clk<1> and Clk<2> can comprise a sequence of uniform clock edges that can be used to digitize the zero-crossing time, such as the zero-crossing time point 408 at which the ZCB signal transitions past the threshold voltage Vth. Although three DFFs 452 are illustrated in FIG. 4, a quantizer may have any number of DFFs, depending on application. For example, a four-bit quantizer would include $2^n-1$ (15) DFFs.

Figure 5:
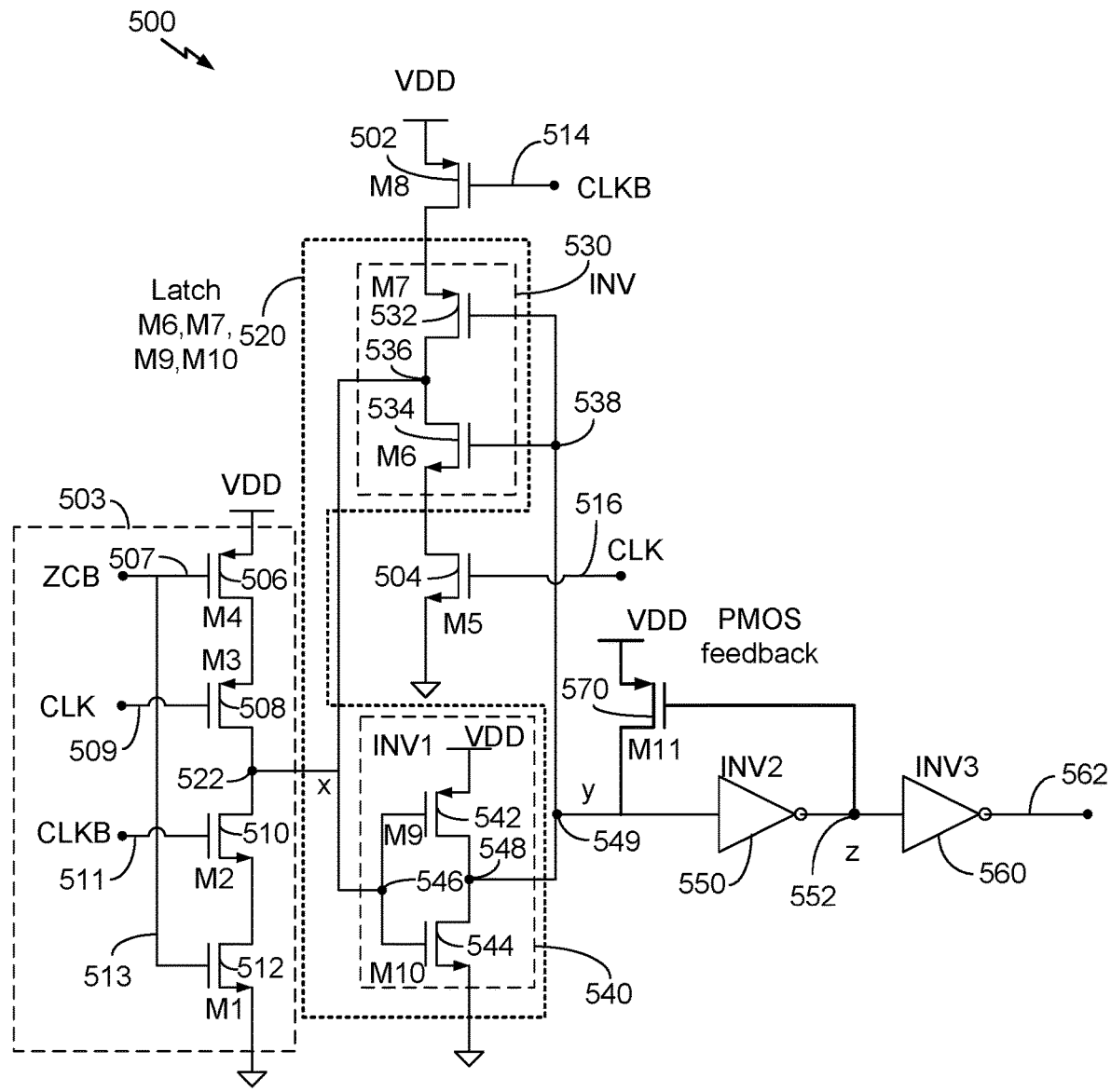
FIG. 5 is a schematic diagram showing a D-type flip-flop (DFF).

FIG. 5 is a schematic diagram showing a D-type flip-flop (DFF) 500. The DFF 500 may be a representation of one of the DFFs 452-1 through 452-3 of FIG. 4. In other embodiments, the DFF 500 may be representative of another flip-flop in the wireless device 200 (FIG. 2).

In an exemplary embodiment, the DFF 500 comprises a transistor 502, a latch 520, an input circuit 503, a non-gated inverter 550 and a non-gated inverter 560. In an exemplary embodiment, the input circuit 503 comprises a transistor 506, a transistor 508, a transistor 510 and a transistor 512. In an exemplary embodiment, the transistor 506 and the transistor 508 each comprise a P-type metal oxide semiconductor (PMOS) transistor and the transistor 510 and the transistor 512 each comprise an N-type metal oxide semiconductor (NMOS) transistor.

The PMOS transistor 506 has a source coupled to a system voltage, VDD and a drain coupled to the source of the PMOS transistor 508. The drain of the PMOS transistor 508 is coupled to the drain of the NMOS transistor 510. The source of the NMOS transistor 510 is coupled to the drain of the NMOS transistor 512. The source of the NMOS transistor 512 is coupled to system ground, which in a differential signal implementation may also be referred to as VSS.

The gate of the PMOS transistor 506 and the gate of the NMOS transistor 512 are configured to receive the data signal, ZCB, as an input signal, and may be coupled to the output of the ZCD 420 (FIG. 4) on connection 415, for example. The gate of the PMOS transistor 508 is configured to receive a CLK signal as an input, and the gate of the NMOS transistor 510 is configured to receive a CLKB (CLK_bar) signal as an input. In an exemplary embodiment, the CLK and CLKB signals may comprise the "true" and the "complement" of one of the clock input signals Clk<0>, Clk<1> and Clk<2> shown in FIG. 4. An output, "x", of the input circuit 503 is provided from the node 522 located at the drain of the PMOS transistor 508 and the drain of the NMOS transistor 510.

The latch 520 comprises a gated inverter 530, a non-gated inverter 540, a PMOS transistor 502 and an NMOS transistor 504. The gated inverter 530 comprises a PMOS transistor 532 and an NMOS transistor 534. The non-gated inverter 540 comprises a PMOS transistor 542 and an NMOS transistor 544.

The transistor 502 comprises a PMOS transistor having a source coupled to the system voltage, VDD, and a drain coupled to the source of the PMOS transistor 532. The gate of the PMOS transistor 502 is configured to receive the CLKB signal as an input on connection 514. The drain of the PMOS transistor 532 is coupled to the drain of the NMOS transistor 534. The source of the NMOS transistor 534 is coupled to the drain of the NMOS transistor 504. The source of the NMOS transistor 504 is coupled to system ground. The gate of the NMOS transistor 504 is configured to receive the CLK signal as an input on connection 516.

The source of the PMOS transistor 542 is coupled to the system voltage, VDD, and the drain of the PMOS transistor 542 is coupled to the drain of the NMOS transistor 544. The source of the NMOS transistor 544 is coupled to system ground.

A node 536 is formed at the drain of the PMOS transistor 532 and the drain of the NMOS transistor 534. A node 546 is formed at the gate of the PMOS transistor 542 and the gate of the NMOS transistor 544. The node 536 and the node 546 are coupled together and coupled to the node 522. The node 546 is configured to receive as input to the non-gated inverter 540 the voltage at the node 522 "x" at the output of the input circuit 503.

A node 538 is formed at the gate of the PMOS transistor 532 and the gate of the NMOS transistor 534. A node 548 is formed at the drain of the PMOS transistor 542 and the drain of the NMOS transistor 544. The node 538 and the node 548 are coupled together and to a node 549 configured to provide as output the voltage at the node 549 "y" of the non-gated inverter 540 and the latch 520. In an exemplary embodiment, the latch 520 may be configured to store one of two states. A first state may comprise the voltage at node 522 "x" being 0 (logic low) and the voltage at node 549 "y" being VDD (logic high, or 1). A second state may comprise the voltage at node 522 "x" being VDD (logic high, or 1) and the voltage at node 549 "y" being 0 (logic low).

The signal "y" at the node 549 is provided as an input to the non-gated inverter 550. The output, "z", of the non-gated inverter 550 is provided on a connection including a node 552 as an input to the non-gated inverter 560. The output of the non-gated inverter 560 on connection 562 is provided as the output of the DFF 500. The non-gated inverter 550 and the non-gated inverter 560 may be configured similar to the non-gated inverter 540 and will not be described in detail.

In an exemplary embodiment, a PMOS transistor 570 (M11) is coupled as a feedback element coupling the node 552 to the node 549. Such configuration may provide additional current, that is, under some conditions the PMOS transistor 570 (M11) operates as a current source. In an exemplary embodiment, the PMOS transistor 570 (M11) has a source coupled to the system voltage, VDD, a gate coupled to the node 552 and a drain coupled to the node 549. In an exemplary embodiment, the system voltage, VDD, may be considered a reference voltage.

Figure 6:
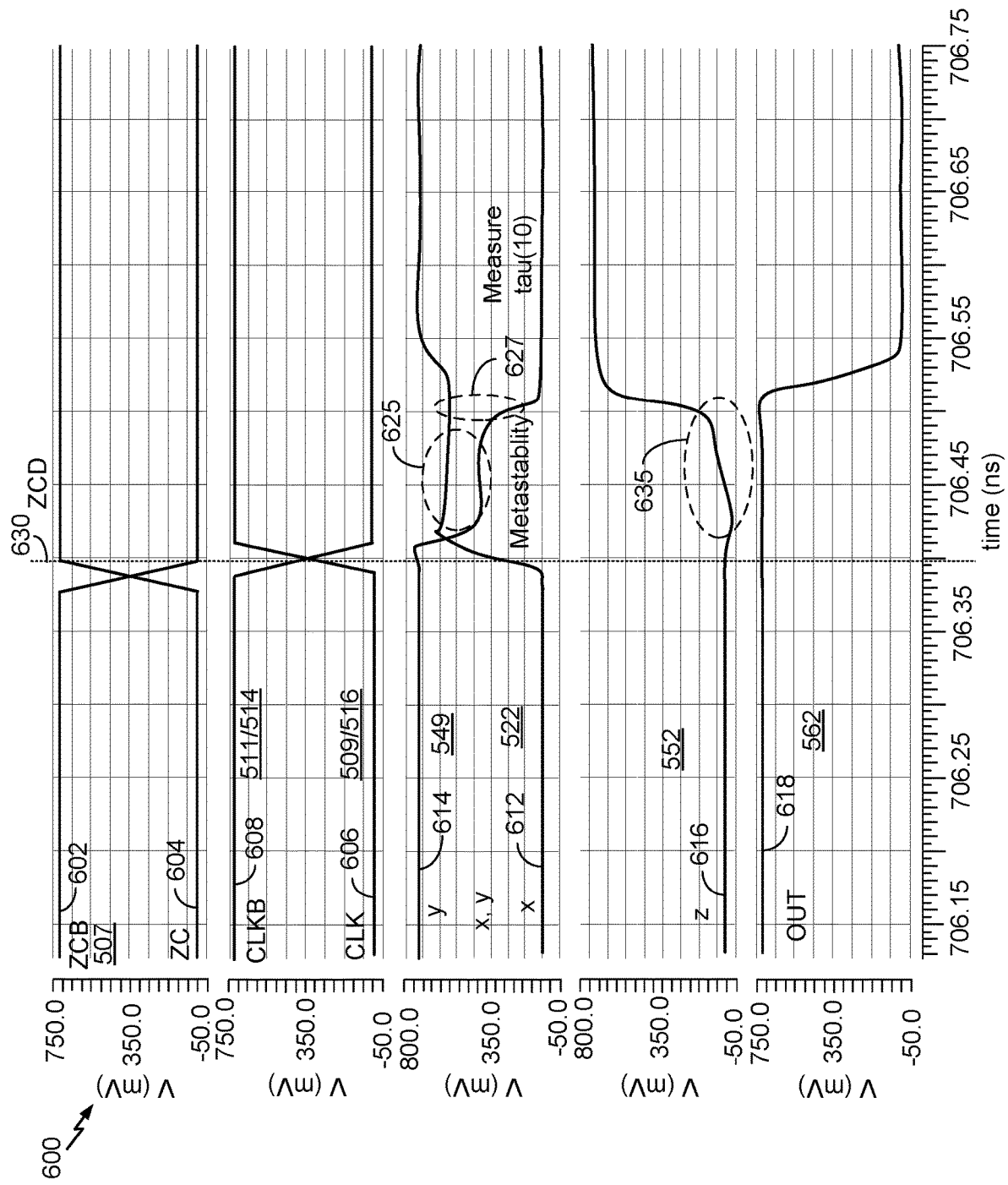
FIG. 6 shows a timing diagram of the signals associated with the D-type flip-flop (DFF) of FIG. 5.

FIG. 6 shows a timing diagram of the signals associated with the D-type flip-flop 500 of FIG. 5. The timing diagram 600 shows the data signal, ZCB, using trace 602, the data signal, ZC, using trace 604, the clock signal, CLK, using trace 606, the CLKB signal using trace 608, the voltage at node 522 "x" using trace 612, the voltage at node 549 "y" using trace 614, the voltage at node 552 "z" using trace 616 and the output voltage on connection 562 using trace 618.

In an exemplary embodiment, the initial condition of the DFF 500 comprises a state where the data signal, ZCB 602, is logic high (1), the clock signal, CLK 606, is logic low (0), the clock bar signal, CLKB 608 is logic high (1), the voltage at node 522 "x" is at logic low (0), the voltage at node 549 "y" is logic high (1), and the voltage at node 552 "z" is logic low (0). In this exemplary embodiment, the voltage at node 522 "z" starts at logic low (0). In this example, the term "logic high" also refers to the voltage at the subject node being close to the system voltage, VDD; and the term "logic low" also refers to the voltage at the subject node being close to the system ground, 0 volts. The term "logic high" may also refer to the voltage at the subject node being beyond a mid-point of a differential voltage between a system voltage VDD and a system ground VSS closer to VDD; and the term "logic low" may also refer to the voltage at the subject node being beyond a mid-point of the differential voltages VDD and VSS closer to VSS.

In an exemplary embodiment, as the data signal, ZCB, 602 transitions from logic high to logic low, the clock signal, CLK, 606 transitions from logic low to logic high. The zero crossing point determined by the zero crossing detector, ZCD 420 (FIG. 4) is shown using reference numeral 630 at which time the clock signal, CLK, 606 transitions from logic low to logic high.

When the clock signal, CLK, 606 begins transitioning, the voltage at node 522 "x" begins transitioning, and shortly thereafter, the voltage at node 549, "y" also begins to transition. In this exemplary embodiment, the voltage at node 522 "x" begins to transition from logic low to logic high, and the voltage at node 549 "y" begins to transition from logic high to logic low. However, for the reasons stated above, it is possible that a DFF may enter a state of metastability. For example, if the voltages at the nodes 522 "x" and 549 "y" slows and ceases to diverge, at least for a period of time (e.g., in the region 625 in FIG. 6), it may be possible that the DFF may enter a state of metastability. This metastable condition may lead to ambiguity in the voltage at node 552 "z." This may affect the transition of the output signal 618 (the output of the DFF 500 on connection 562 of FIG. 5), in this example from a logic high to a logic low. If the transition time of the output signal 618 from one logic state to another logic state exceeds the timing parameters of the circuit in which such DFF is implemented, errors will result.

The above-mentioned time constant, $\tau_{10}$, may be measured within approximately the region indicated at reference numeral 627, where the voltages at the nodes 522 "x" and 549 "y" begin to diverge. To determine $\tau_{10}$, the |X-Y-Voffset| may be plotted on a log scale. When Voffset is selected properly, the plot results in a straight line on a log scale, and $\tau_{10}$ is the time that it takes |X-Y-Voffset| to grow by 10×, for example, from 1 mV (millivolt) to 10 mV. The term |X-Y| is exponential over time, to which a constant term, Voffset, is added. The constant term, Voffset, is chosen, such that when subtracted, only the exponential term |X-Y| remains. If there is a portion of the constant term, Voffset, that is left over, the remaining portion will prevent the response from being a straight line on a log scale. Voffset is the voltage of |X-Y| if the voltages at node 522 "x" and node 549 "y" remain in metastable condition. The time $\tau_{10}$ can be measured in the region 627 during the time that "x" and "y" diverge.

In accordance with an exemplary embodiment, in order to reduce the likelihood that the DFF 500 enters a metastable state or reduce the time in which the DFF 500 is in the metastable state, the PMOS transistor 570 (M11) (FIG. 5), acts to allow the voltages at the nodes 522 "x" and 549 "y" to more quickly diverge than if the PMOS transistor 570 (M11) were not present. The additional current provided by the PMOS transistor 570 (M11) to the node 549 increases the state transition speed of the voltage at the node 552 "z", and leads to a corresponding faster transition of the output signal 618 on connection 562.

As mentioned above, the voltage input at node 522 "x" and voltage output at node 549 "y" of the non-gated inverter 540 in the DFF 500 may diverge exponentially with the time constant, $\tau_{10}$. The value of $\tau_{10}$ is approximately proportional to gm/C, where gm is the total transconductance of the transistors that comprise the inverters in the latch 520, and "C" is a combination of capacitances at the input node 522 and output node 549 of the latch 520. The value $\tau_{10}$ can be defined as the time it takes the differential voltages at the input node 522 "x" and the output node 549 "y" of the non-gated inverter 540 to change by a factor of ten (10).

In an exemplary embodiment, the DFF 500 may be used as part of a phase sampler to compare clock and data signals to determine whether the clock signal or the data signal occurs earlier. A group of uniformly spaced clock pulses are used to sample the data. The output of the phase sampler 450 (FIG. 4) can be low (0) or high (1) depending on whether the clock signal or the data signal transitions earlier. The signals CLK and CLKB are complementary clock input signals comprising differential signals. The data signals ZC and ZCB are also complementary data input signals comprising differential signals that represent a data input that transitions from a logic low to a logic high, or from logic high to logic low.

Metastability may occur in a DFF if the total current (PMOS and NMOS) through the transistors 534 (M6) and 532 (M7) equals the total current through the transistors 542 (M9) and 544 (M10), so if PMOS current=NMOS current, then the DFF is considered to be in a metastable state. In this metastable state, the voltage at node 522 "x" and the voltage at node 549 "y" are close to VDD/2 and may not diverge over a period of time, or may diverge at a rate sufficiently slow to cause errors.

In the exemplary embodiment of FIG. 5, in contrast, the voltage at node 552 "z" starts at logic low and slowly rises to a logic high state because the gain (gm) of the non-gated inverter 550 (INV2) is low. Keeping the voltage at node 552 "z" low, as shown during the time period indicated using reference numeral 635, helps the DFF 500 to more quickly exit metastability, as described below.

In an exemplary embodiment, the PMOS transistor 570 (M11) is coupled as a feedback element coupling the signal on node 552 "z" to the signal on node 549 "y" to provide additional current at the node 549, that is, in an exemplary embodiment the PMOS transistor 570 (M11) operates as a current source. In an exemplary embodiment, the PMOS transistor 570 (M11) has a source coupled to the system voltage, VDD, a gate coupled to the node 552 and a drain coupled to the node 549.

If the voltage at the node 552 "z" remains close to zero volts (0V) as shown during the time period 635, then the PMOS transistor 570 (M11) is on and functions as a pull up transistor, raising the voltage at the node 549 toward the system voltage, VDD.

As a result of the PMOS transistor 570 (M11) pulling the voltage at the node 549 "y" toward the system voltage, VDD, the voltage at the node 522 "x" becomes higher than VDD/2, since the current, $I_{M9}$ through the PMOS transistor 542 (M9)+the current $I_{M11}$ through the PMOS transistor 570 (M11)=the current $I_{M10}$ through the NMOS transistor 544 (M10) if the DFF 500 were to be in a metastable condition. Because of this, the voltage at node 522 "x" becomes higher than VDD/2, which increases the overall gain (gm) of the latch 520, which then shortens the time $\tau_{10}$. In a metastable state, the total PMOS current equals the total NMOS current.

Because the PMOS transistor 570 (M11) operates as a pull up transistor in this embodiment, the current flowing through the PMOS transistor 542 (M9) in the non-gated inverter 540 (INV1) draws less relative current and the NMOS transistor 544 (M10) in the non-gated inverter 540 (INV1) draws more relative current so that the current through the PMOS transistor 542 (M9) equals the current through the NMOS transistor 544 (M10). For this to occur, the voltage at node 522 "x" is higher than VDD/2, causing the NMOS transistor 544 (M10) to draw more current relative to the PMOS transistor 542 (M9); and causing the PMOS transistor 542 (M9) to draw less current relative to the NMOS transistor 544 (M10). The current through the PMOS transistor 570 (M11) balances the total PMOS and NMOS current through the PMOS transistor 542 (M9) and the NMOS transistor 544 (M10), while encouraging the voltage at the node 522 "x" to be higher than VDD/2. As long as the PMOS transistor 570 (M11) is weaker than the NMOS transistor 544 (M10), a steady state operating point can be achieved where the current through the NMOS transistor 544 (M10) is equal to the sum of the currents through the PMOS transistor 542 (M9) and the PMOS transistor 570 (M11). As used herein, the term "weaker" refers to a condition where the maximum current delivered by the PMOS transistor 570 (M11) is less than the maximum current drawn by the NMOS transistor 544 (M10). The difference between the current drawn by the NMOS transistor 544 (M10) and the current delivered by the PMOS transistor 570 (M11) is the current drawn by the PMOS transistor 542 (M9). A balanced state can be achieved in a configuration in which the maximum current drawn by the NMOS transistor 544 (M10) when the voltage at the node 522 "x" is equal to the system voltage, VDD, is greater than the maximum current drawn by the PMOS transistor 570 (M11). In order to counter the additional current through the PMOS transistor 570 (M11), the voltage at the node 522 "x" increases to increase the current through the NMOS transistor 544 (M10). If the PMOS transistor 570 (M11) were to be stronger than the NMOS transistor 544 (M10), such a balanced point may no longer exist, and the voltage at the node 549 "y" may be pulled all the way up to the system voltage level, VDD, and the voltage at the node 522 "x" may drop to system ground, VSS, which may cause the voltage at the node 549 "y" to be tied to VDD, and the DFF 500 may fail to respond to its input. As used herein, the term "stronger" refers to a condition where the maximum current delivered by the PMOS transistor 570 (M11) is greater than the maximum current drawn by the NMOS transistor 544 (M10).

The gm (gain) of the non-gated inverter 540 is at a minimum when the voltage at node 522 "x" and the voltage at node 549 "y" are at VDD/2 because both the NMOS transistor 534 (M6) and the PMOS transistor 532 (M7) are barely on, and both the NMOS transistor 544 (M10) the and PMOS transistor 542 (M9) are barely on.

Because the voltage at the node 522 "x" is at a higher voltage than the voltage at the node 549 "y" as a result of the additional current provided by the PMOS transistor 570 (M11) to the node 549, the overall gm of the non-gated inverter 540 (INV1) is higher than when the voltage at the node 522 "x" equals the voltage at the node 549, "y", that is, when the voltage at node 522 "x" and the voltage at node 549 "y" are both close to or at VDD/2. A higher gm of the gated inverter 530, comprising PMOS transistor 532 (M6) and NMOS transistor 534 (M7) and a higher gm of the non-gated inverter 540, comprising PMOS transistor 542 (M9) and NMOS transistor 544 (M10) makes the voltages at the node 522 "x" and the node 549 "y" diverge quicker. This quicker divergence of the voltages at the node 522 "x" and the node 549 "y" may occur only if the DFF 500 enters a metastable state in some configurations, such that the divergence of the voltages at the node 522 "x" and the node 549 "y" is faster for the worst-case condition only, that is when the DFF is in a metastable state. In addition, slow drifting of current through the PMOS transistor 570 (M11) may also further disturb a metastable state of the DFF 500 to make it harder for the DFF 500 to remain in the metastable state.

Figure 7:
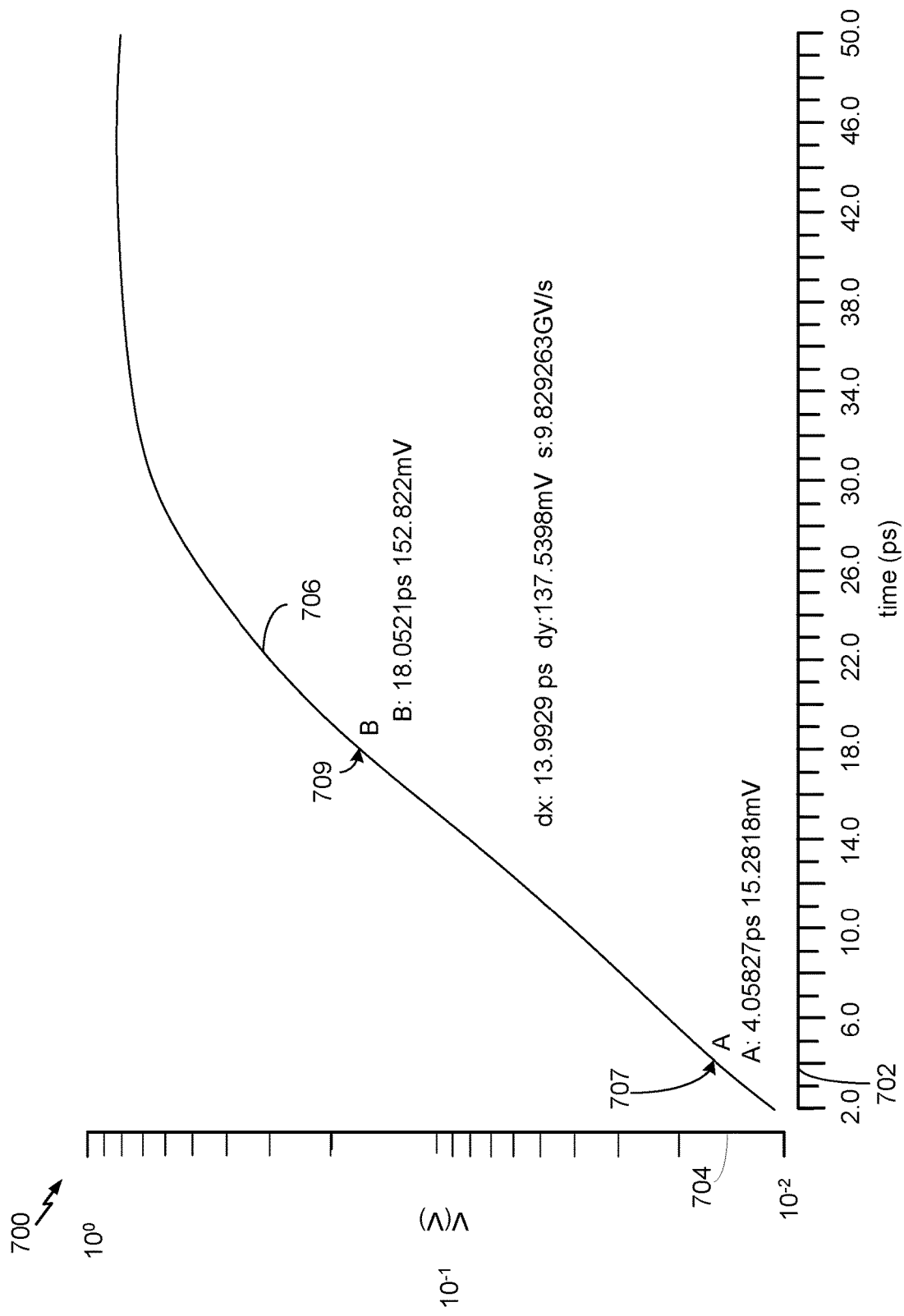
FIG. 7 is a graph showing an example of a way to measure the value of $\tau_{10}$.

FIG. 7 is a graph 700 showing an example of a way to measure the value of $\tau_{10}$. The horizontal axis 702 shows time in picoseconds (ps), and the vertical axis 704 shows voltage, in volts (V). The portion of the trace 706 between the time 707 and the time 709 shows a ten-fold increase in voltage, from approximately 15.28 mV to approximately 152.82 mV over a time period of approximately 14 ps. As mentioned above the term |X-Y-Voffset| is represented by the substantially straight-line portion of the trace 706 between the points 707 and 709 on a log scale, which when taken over a sufficient period of time (approximately 14 ps in this example) provides a time period over which a value for $\tau_{10}$ can be measured. The time between the points 707 and 709 in this example correspond to a time period within the region 627 of FIG. 6. The term "s:9.829263GV/s" refers to the slope of the trace 706 between point A 707 and point B 709, where GV/s is $10^9$ Volt/sec.

Figure 8A:
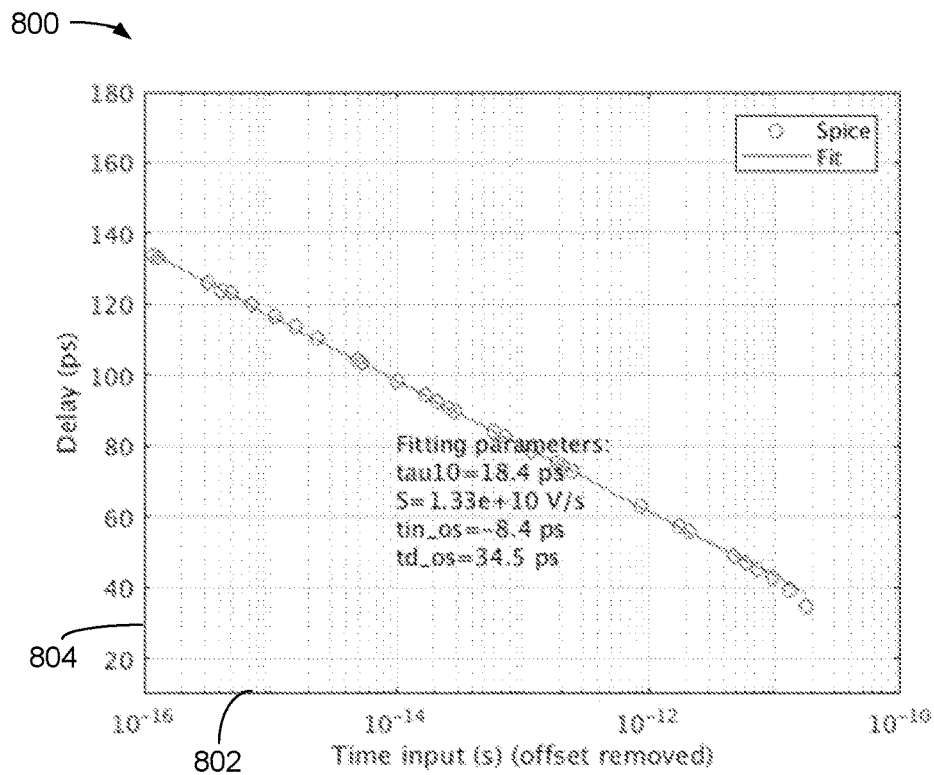
FIG. 8A and FIG. 8B are graphs showing the improvement in $\tau_{10}$ in the D-type flip-flop (DFF) of FIG. 5.
Figure 8B:
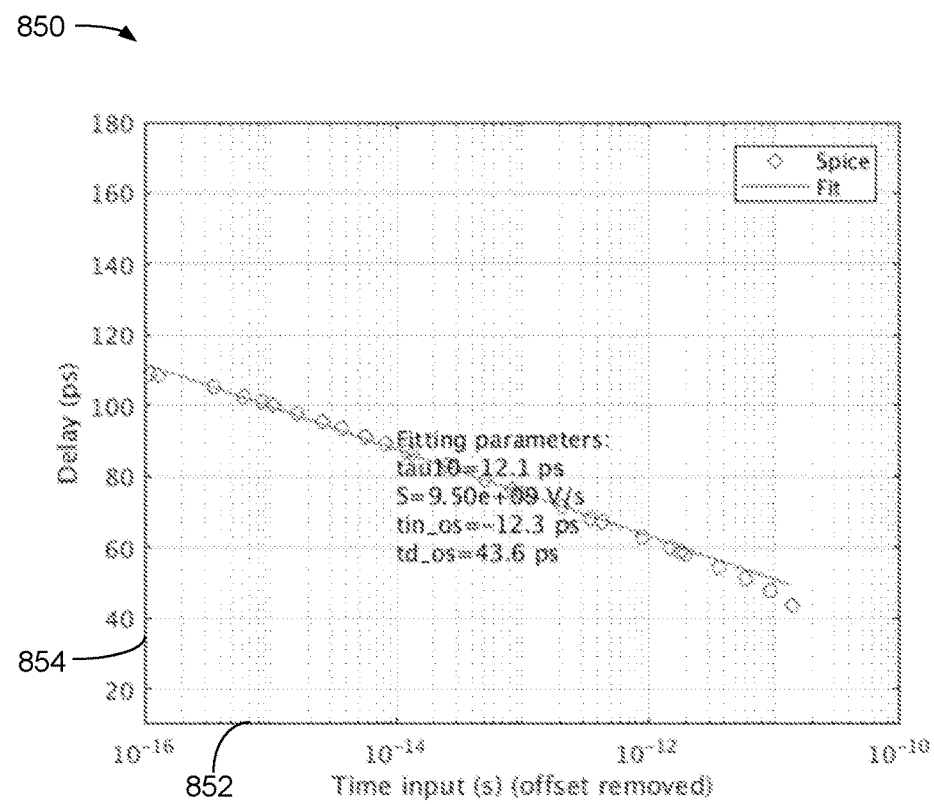

FIG. 8A and FIG. 8B are graphs showing the improvement in $\tau_{10}$ in the D-type flip-flop 500 of FIG. 5. In FIG. 8A, the graph 800 includes a horizontal axis 802 that shows time input in seconds (s) and a vertical axis 804 that shows delay through the flip-flop in picoseconds (ps). FIG. 8A shows a $\tau_{10}$ of 18.4 ps occurring without the transistor 570 (FIG. 5).

In FIG. 8B, the graph 850 includes a horizontal axis 852 that shows time input in seconds (s) and a vertical axis 854 that shows delay through the flip-flop in picoseconds (ps). FIG. 8B shows a $\tau_{10}$ of 12.1 ps, which is a significant improvement over the delay shown in FIG. 8A when the transistor 570 is implemented as shown in FIG. 5.

Figure 9:
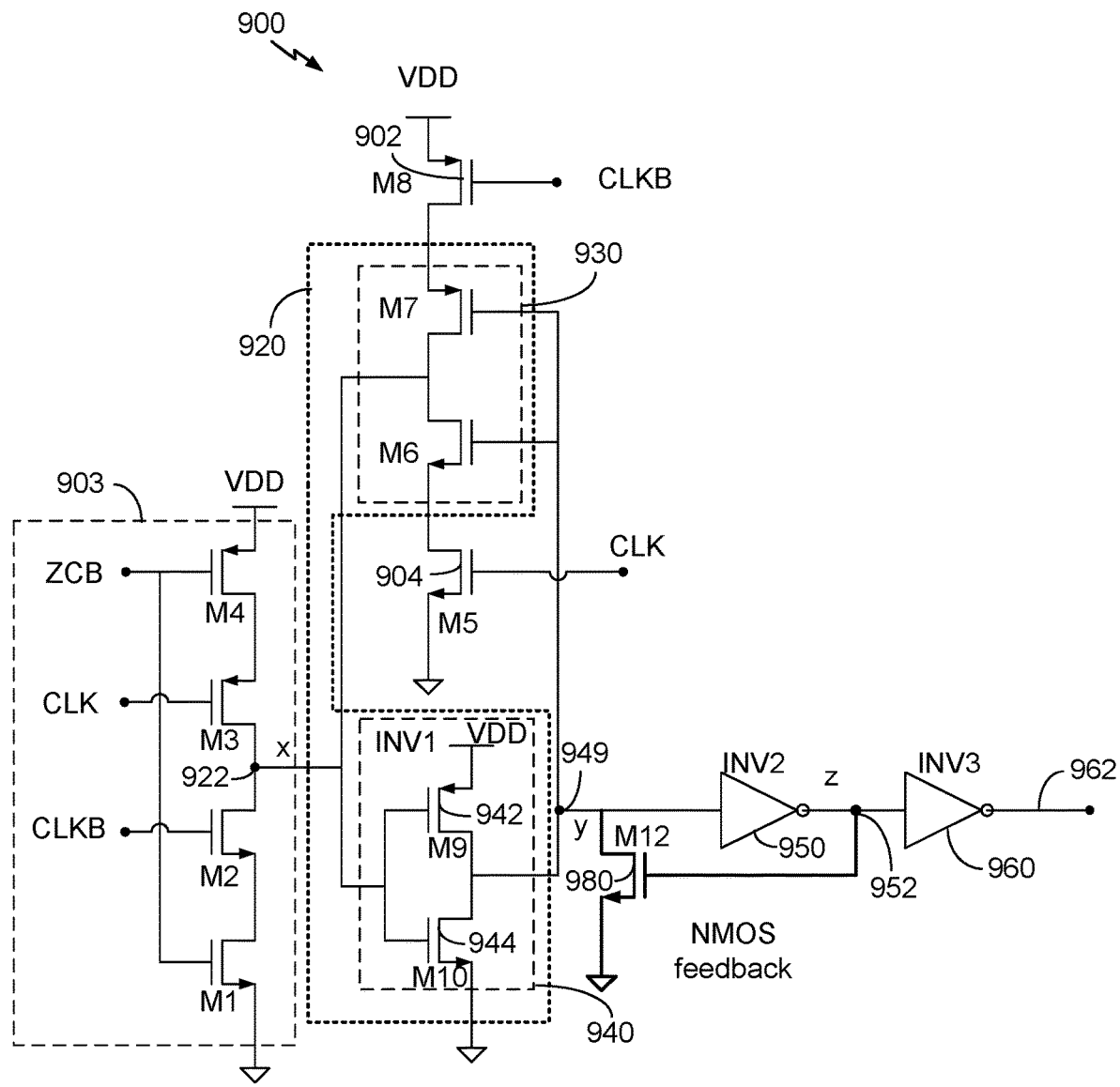
FIG. 9 is a schematic diagram showing an alternative embodiment of the D-type flip-flop (DFF) of FIG. 5.

FIG. 9 is a schematic diagram showing an alternative embodiment of the D-type flip-flop (DFF) 500 of FIG. 5. In FIG. 9, items that are similar to corresponding items in FIG. 5 will use the nomenclature 9XX, where an element in FIG. 9 labeled 9XX is similar to an element in FIG. 5 labeled 5XX. In addition, some of the details of elements in FIG. 9 have been omitted for simplicity. For example, because the input circuit 903 in FIG. 9 is similar to the input circuit 503 in FIG. 5, some of the reference numerals and description from FIG. 5 has been omitted from FIG. 9.

In FIG. 9, instead of the PMOS transistor 570 coupled as a current feedback element coupling the node 552 to the node 549 in the DFF 500 of FIG. 5, an NMOS transistor 980 is coupled as a current feedback element coupling the node 952 to the node 949. In an exemplary embodiment, the NMOS transistor 980 has a drain coupled to the node 949, a gate coupled to the node 952 and a source coupled to system ground. In an exemplary embodiment, the system ground (which may also be a system voltage, VSS) may be considered a reference voltage. In this manner, when the initial state of the voltage at the node 922 "x" and the voltage at the node 949 "y" is opposite that of FIG. 5, for example when the initial state of the node 952 "z" is logic high, the NMOS transistor 980 operates as a current sink to cause the voltage at the node 922 "x" and the voltage at the node 949 "y" to diverge quicker, thereby reducing or minimizing the time $\tau_{10}$.

In an exemplary embodiment, the NMOS transistor 980 (M12) helps avoid metastability in an example in which the data signal, ZCB, transitions from a logic low (0) to a logic high (1) and where the initial condition of the signal at node 952 "z" is logic high (1) and transitions to logic low (0). In such a case, the voltage at the node 952 "z" starts at a logic high (1) and the NMOS transistor 980 (M12) is on and acts as a current sink, causing the voltage at the node 922 "x" to be at a voltage lower than VDD/2, thus shortening the time $\tau_{10}$.

As a result of the NMOS transistor 980 (M12) pulling the voltage at the node 949 "y" toward the system ground, VSS, the voltage at the node 922 "x" becomes lower than VDD/2, since the current, $I_{M10}$ through the NMOS transistor 944 (M10)+the current $I_{M12}$ through the NMOS transistor 980 (M12)=the current $I_{M9}$ through the PMOS transistor (M9) when the DFF 900 is in a metastable condition, as mentioned above.

In this exemplary embodiment, the overall gm of the latch 920 increases as a result as well. In this example, the voltage at the node 949 "y" being pulled toward the system voltage, VDD, is avoided by designing NMOS transistor 980 (M12) to be weaker than the PMOS transistor 942 (M9).

Figure 10:
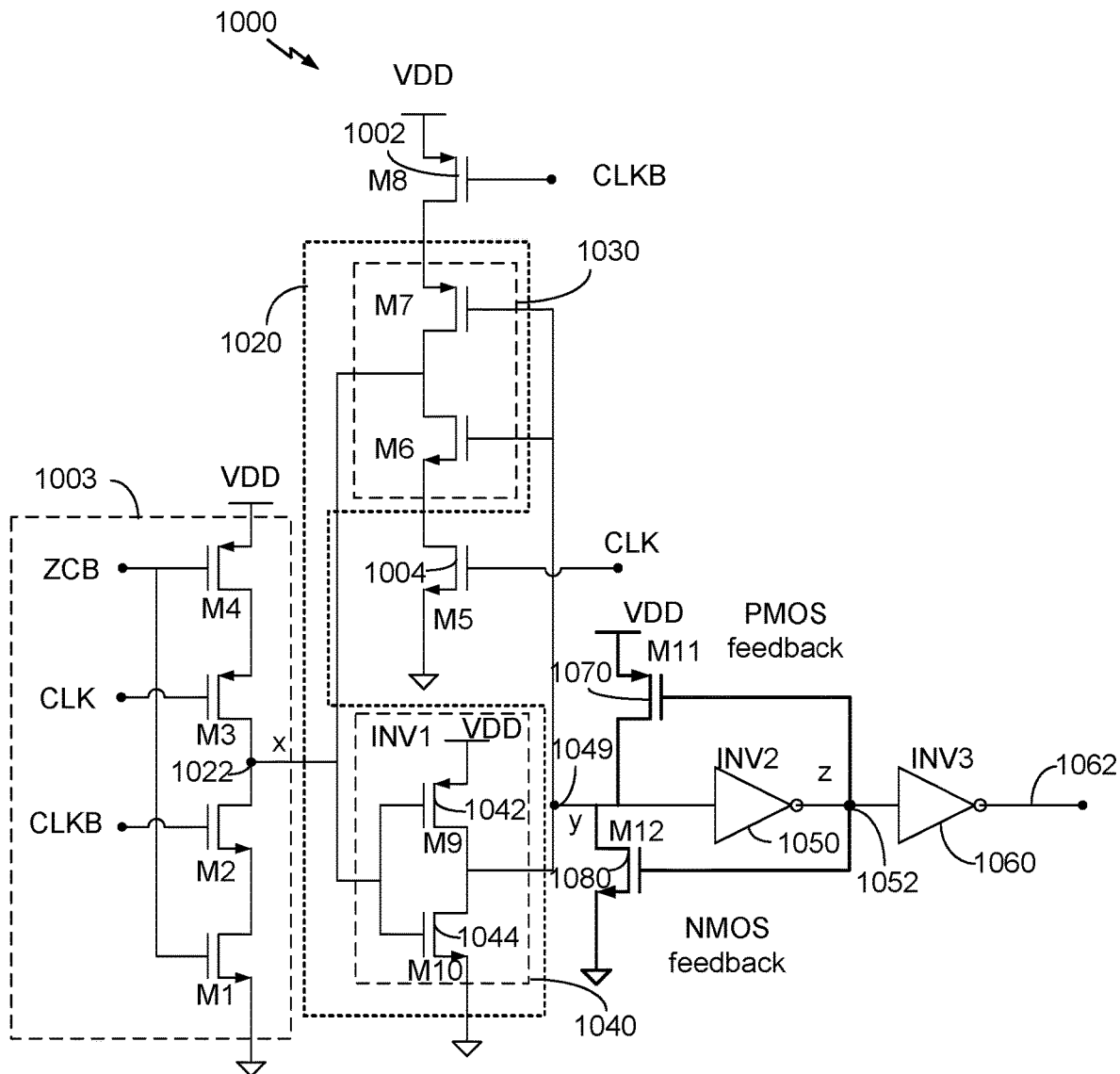
FIG. 10 is a schematic diagram showing an alternative embodiment of the D-type flip-flop (DFF) of FIG. 5.

FIG. 10 is a schematic diagram showing an alternative embodiment of the D-type flip-flop (DFF) 500 of FIG. 5. In FIG. 10, items that are similar to corresponding items in FIG. 5 will use the nomenclature 10XX, where an element in FIG. 10 labeled 10XX is similar to an element in FIG. 5 labeled 5XX. In addition, some of the details of elements in FIG. 10 have been omitted for simplicity. For example, because the input circuit 1003 in FIG. 10 is similar to the input circuit 503 in FIG. 5, some of the reference numerals and description from FIG. 5 has been omitted from FIG. 10.

In FIG. 10, in addition to the PMOS transistor 1070 coupled as a current feedback element coupling the node 1052 to the node 1049 in the DFF 1000, an NMOS transistor 1080 is also coupled as a current feedback element coupling the node 1052 to the node 1049. In an exemplary embodiment, the PMOS transistor 1070 has a source coupled to the system voltage, VDD, a gate coupled to the node 1052 and a drain coupled to the node 1049. In an exemplary embodiment, the NMOS transistor 1080 has a drain coupled to the node 1049, a gate coupled to the node 1052 and a source coupled to system ground. In an exemplary embodiment, one or both of the system voltage, VDD, and the system ground (which may also be a system voltage, VSS) may be considered a reference voltage. In this manner, depending on the initial state of the voltage at the node 1022 "x" and the voltage at the node 1049 "y" at least one of the PMOS transistor 1070 and the NMOS transistor 1080 operate to cause the voltage at the node 1022 "x" and the voltage at the node 1049 "y" to diverge quicker, thereby reducing or minimizing the time $\tau_{10}$.

In an exemplary embodiment where the initial condition of the signal at node 1052 "z" is logic low (0) and transitions to logic high (1), the PMOS transistor 1070 (M11) is on and the NMOS transistor 1080 (M12) is off. As a result of the PMOS transistor 1070 (M11) pulling the voltage at the node 1049 "y" toward the system voltage, VDD, the voltage at the node 1022 "x" becomes higher than VDD/2, since the current, $I_{M9}$ through the PMOS transistor 1042 (M9)+the current $I_{M11}$ through the PMOS transistor 1070 (M11)=the current $I_{M10}$ through the NMOS transistor (M10) when the DFF 1000 is in a metastable condition, as mentioned above. Because of this, the voltage at node 1022 "x" is higher than VDD/2. In a metastable state, the total PMOS current equals the total NMOS current.

The addition of the NMOS transistor 1080 (M12) helps avoid metastability in an example in which the data signal, ZCB, transitions from a logic low (0) to a logic high (1) and where the initial condition of the signal at node 1052 "z" is logic high (1) and transitions to logic low (0). In such a case, the voltage at the node 1052 "z" starts at a logic high (1) and the PMOS transistor 1070 (M11) is off. The NMOS transistor 1080 (M12) is on and acts as a current sink, causing the voltage at the node 1022 "x" to be at a voltage lower than VDD/2, thus shortening the time $\tau_{10}$.

As a result of the NMOS transistor 1080 (M12) pulling the voltage at the node 1049 "y" toward the system ground, VSS, the voltage at the node 1022 "x" becomes lower than VDD/2, since the current, $I_{M10}$ through the NMOS transistor 1044 (M10)+the current $I_{M12}$ through the NMOS transistor 1080 (M12)=the current $I_{M9}$ through the PMOS transistor (M9) when the DFF 1000 is in a metastable condition, as mentioned above.

In this exemplary embodiment, the overall gm of the latch 1020 increases as a result as well. In this example, the voltage at the node 1049 "y" being pulled toward the system voltage, VDD, is avoided by designing the PMOS transistor 1070 (M11) to be weaker than the NMOS transistor 1044 (M10), and by designing the NMOS transistor 1080 (M12) to be weaker than the PMOS transistor 1042 (M9).

Figure 11:
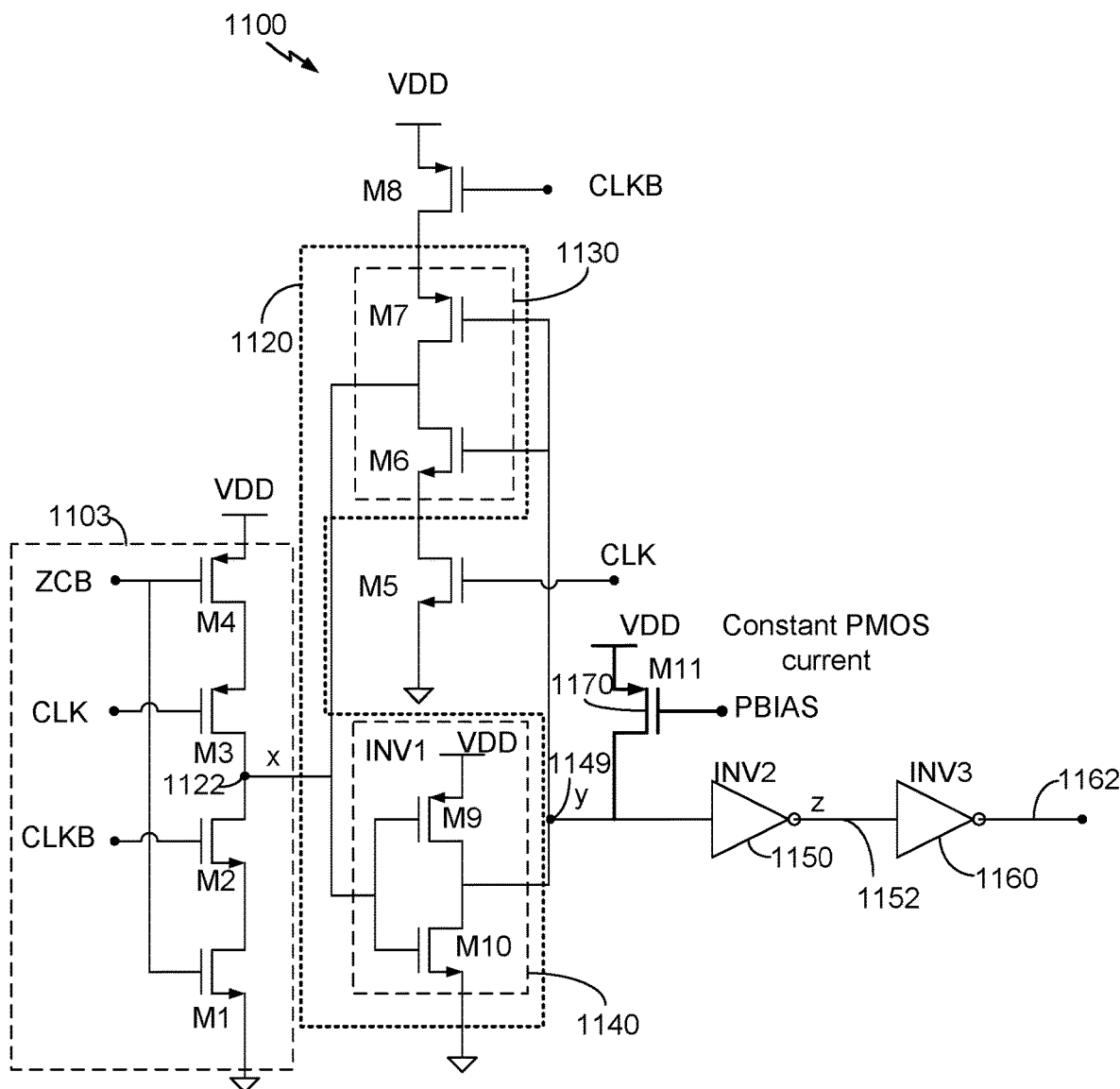
FIG. 11 is a schematic diagram showing an alternative embodiment of the D-type flip-flop (DFF) of FIG. 5.

FIG. 11 is a schematic diagram showing an alternative embodiment of the D-type flip-flop (DFF) 500 of FIG. 5. In FIG. 11, items that are similar to corresponding items in FIG. 5 will use the nomenclature 11XX, where an element in FIG. 11 labeled 11XX is similar to an element in FIG. 5 labeled 5XX. In addition, some of the details of elements in FIG. 11 have been omitted for simplicity. For example, because the input circuit 1103 in FIG. 11 is similar to the input circuit 503 in FIG. 5, some of the reference numerals and description from FIG. 5 has been omitted from FIG. 11.

In FIG. 11, a PMOS transistor 1170 (M11) is coupled to the node 1149 as a constant current source in the DFF 1100. In an exemplary embodiment, the PMOS transistor 1170 (M11) has a source coupled to the system voltage, VDD, a gate coupled to a fixed bias voltage, PBIAS, and a drain coupled to the node 1149. In this manner, the PMOS transistor 1170 (M11) operates to cause the voltage at the node 1122 "x" and the voltage at the node 1149 "y" to diverge quicker, thereby reducing or minimizing the time $\tau_{10}$. The PMOS transistor 1170 (M11) being a constant current source causes the voltage at node 1122 "x" to be higher than VDD/2, which results in higher overall gm of the latch 1120, and a shortening of the time $\tau_{10}$, as mentioned above.

Figure 12:
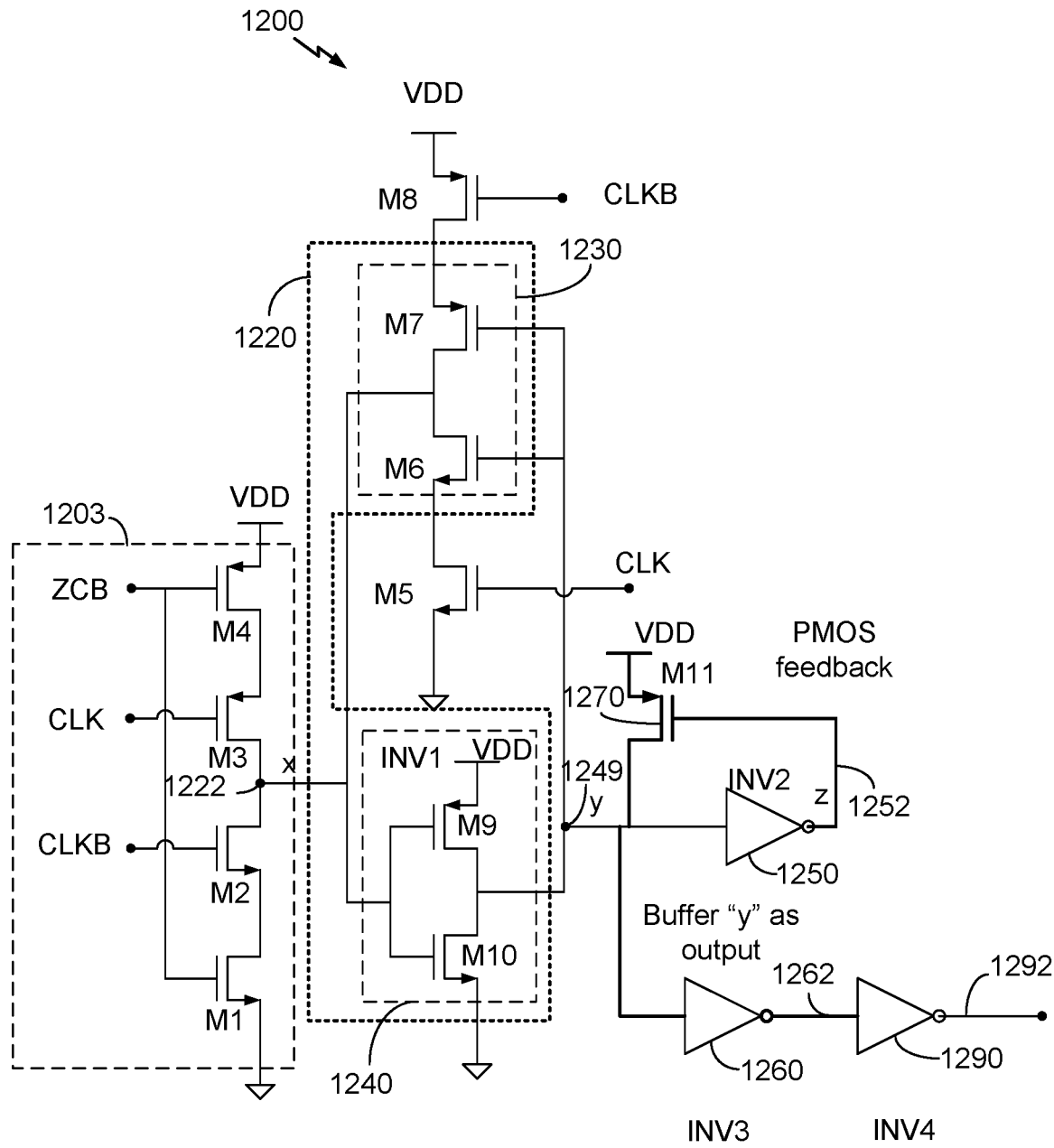
FIG. 12 is a schematic diagram showing an alternative embodiment of the D-type flip-flop (DFF) of FIG. 5.

FIG. 12 is a schematic diagram showing an alternative embodiment of the D-type flip-flop (DFF) 500 of FIG. 5. In FIG. 12, items that are similar to corresponding items in FIG. 5 will use the nomenclature 12XX, where an element in FIG. 12 labeled 12XX is similar to an element in FIG. 5 labeled 5XX. In addition, some of the details of elements in FIG. 12 have been omitted for simplicity. For example, because the input circuit 1203 in FIG. 12 is similar to the input circuit 503 in FIG. 5, some of the reference numerals and description from FIG. 5 has been omitted from FIG. 12.

The D-type flip-flop 1200 in FIG. 12 is similar to the D-type flip-flop 500 in FIG. 5 in that a PMOS transistor 1270 (M11) is coupled as a feedback element coupling the node 1252 to the node 1249 to provide additional current, that is, it operates as a current source. In an exemplary embodiment, the PMOS transistor 1270 (M11) has a source coupled to the system voltage, VDD, a gate coupled to the node 1252 and a drain coupled to the node 1249.

However, in FIG. 12, the D-type flip-flop 1200 includes an arrangement where the input to the non-gated inverter 1260 is taken from the node 1249 and an output of the non-gated inverter 1260 is provided over connection 1262 to another non-gated inverter 1290. The non-gated inverter 1290 is similar to the non-gated inverters 1240, 1250 and 1260, and the output of the non-gated inverter 1290 is provided over connection 1292 as the output of the D-type flip-flop 1200.

The examples of the DFFs described herein are provided in the context of a phase sampler for an ADC. However, the techniques described herein can be used in any (d-type) flip flop. In some embodiments, a DFF as described herein is implemented in a shift register.

Figure 13:
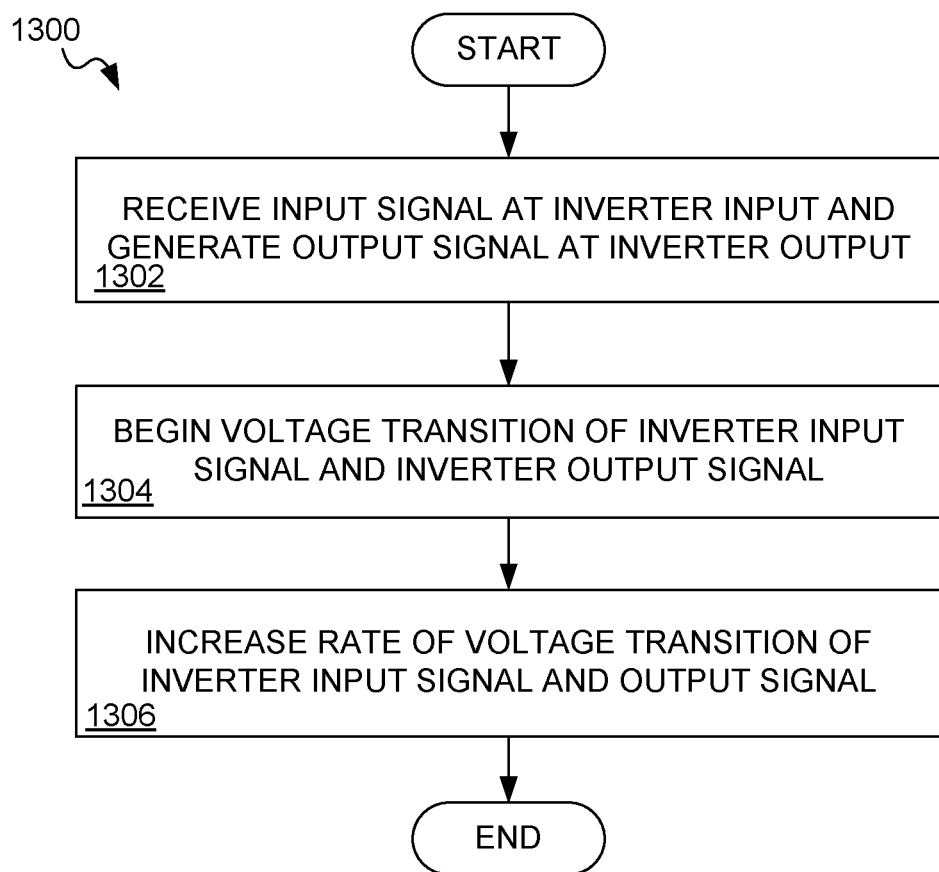
FIG. 13 is a flow chart describing an example of the operation of a D-type flip-flop in accordance with an exemplary embodiment of the disclosure.

FIG. 13 is a flow chart 1300 flow describing an example of the operation of a D-type flip-flop in accordance with an exemplary embodiment of the disclosure. The blocks in the method 1300 can be performed in or out of the order shown, and in some embodiments, can be performed at least in part in parallel.

In block 1302, an input signal is received at an inverter input in a D-type flip-flop. The inverter generates an inverter output signal. For example, an input voltage "x" at node 522 may be provided to the non-gated inverter 540 in the latch 520 of the DFF 500 in FIG. 5 to generate an output voltage "y" at node 549. The input voltage and output voltage may be based on a data input signal, for example the ZCB signal, and one or more clock signals, for example the signals CLK and CLKB, and may be further based on operation of one or more other circuits, such as the input circuit 503 and/or the gated inverter 530.

In block 1304, a voltage transition of the inverter input signal "x" and inverter output signal "y" is begun. For example, the voltage at node 522 "x" and the voltage at node 549 "y" each begin to transition from their respective opposite logic levels. As an example, the voltage at node 522 "x" begins to transition from logic low to logic high, and the voltage at node 549 "y" begins to transition from logic high to logic low.

In block 1306, the rate at which the voltage at node 522 "x" and the voltage at node 549 "y" transition from their respective opposite logic levels is increased. For example, a current device (e.g., a current source, such as the PMOS transistor 570 in FIG. 5, a current sink, such as the NMOS transistor 980 in FIG. 9, or both the PMOS transistor 1070 and the NMOS transistor 1080 in FIG. 10) may flow current that increases the rate of voltage divergence of the voltage at node 522 "x" and the voltage at node 549 "y".

Figure 14:
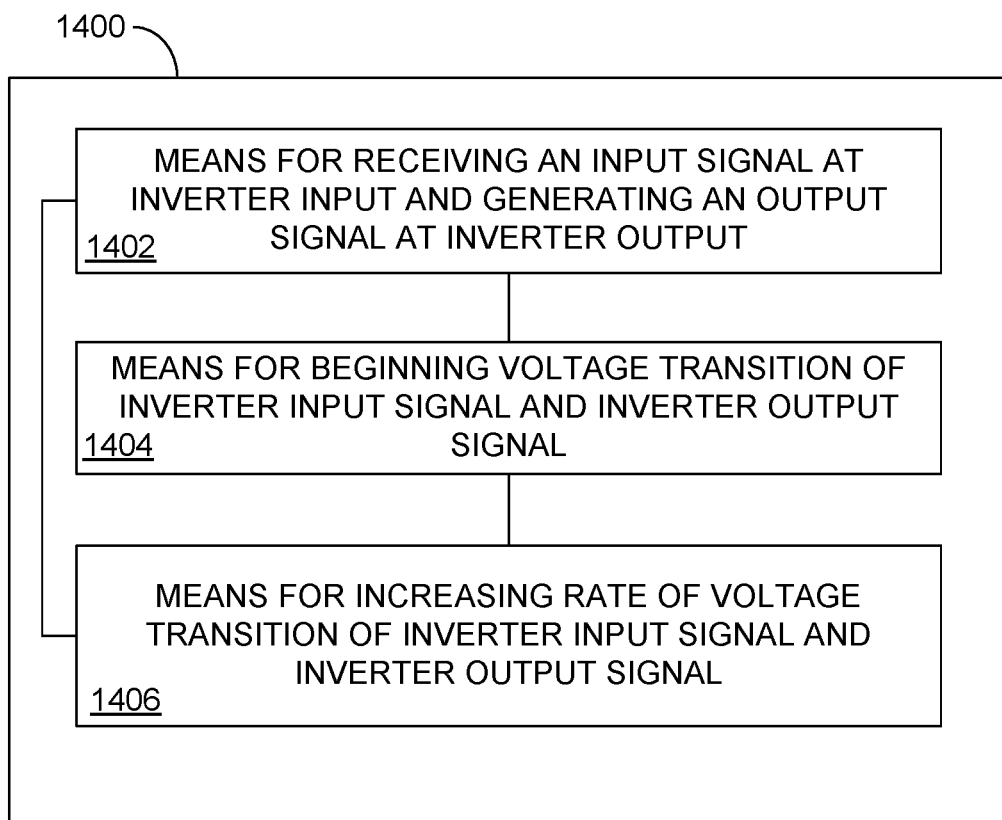
FIG. 14 is a functional block diagram of an apparatus for a D-type flip-flop in accordance with an exemplary embodiment of the disclosure.

FIG. 14 is a functional block diagram of an apparatus 1400 for a D-type flip-flop in accordance with an exemplary embodiment of the disclosure. The apparatus 1400 comprises means 1402 for receiving an input signal at an inverter input and means for generating an output signal at an inverter output. In certain embodiments, the means 1402 for receiving an input signal at an inverter input and means for generating an output signal at an inverter output can be configured to perform one or more of the functions described in operation block 1302 of method 1300 (FIG. 13). In an exemplary embodiment, the means 1402 for receiving an input signal at an inverter input and means for generating an output signal at an inverter output may comprise an input node 522 of an inverter 540 and an output node 549 of the inverter 540 of FIG. 5, respectively.

The apparatus 1400 also comprises means 1404 for beginning a voltage transition of the inverter input signal "x" and the inverter output signal "y." In certain embodiments, the means 1404 for beginning a voltage transition of the inverter input signal "x" and the inverter output signal "y" can be configured to perform one or more of the functions described in operation block 1304 of method 1300 (FIG. 13). In an exemplary embodiment, the means 1404 for beginning a voltage transition of the inverter input signal "x" and the inverter output signal "y" may comprise the inverter 540 of FIG. 5 configured to begin the transition of the signal at node 522 "x" from a logic low state to a logic high state, and configured to begin the transition of the signal at node 549 "y" from a logic high state to a logic low state.

The apparatus 1400 also comprises means 1406 for increasing the rate at which the inverter input signal and inverter output signal transitions. In certain embodiments, the means 1406 for increasing the rate at which the inverter input signal and inverter output signal transitions can be configured to perform one or more of the functions described in operation block 1306 of method 1300 (FIG. 13). In an exemplary embodiment, the means 1406 for increasing the rate at which the inverter input signal and inverter output signal transitions may comprise a transistor configured to provide current at the node 549 (e.g., by flowing current to or from the node 549). For example, the means 1406 may include the PMOS transistor 570 (M11) of FIG. 5 configured to add current at the node 549 to increase the rate at which the signals at nodes 522 "x" and 549 "y" transition. Alternatively, the means 1406 may include the NMOS transistor 980 (M12) of FIG. 9 configured to sink current from the node 949 to increase the rate at which the signals at nodes 922 "x" and 949 "y" transition; or may include the PMOS transistor 1070 (M11) of FIG. 10 configured to add current to the node 1049 and the NMOS transistor 1080 (M12) of FIG. 10 configured to sink current from the node 1049 to increase the rate at which the signals at nodes 1022 "x" and 1049 "y" transition.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A D-type flip-flop (DFF), comprising:
an input circuit having a plurality of transistors configured to receive a clock signal and a data signal;
a first inverter (INV1) having a pair of transistors, the first inverter configured to receive an input voltage (x) from the input circuit at a first inverter input, the first inverter configured to provide an output voltage (y) to a first inverter output;
a second inverter (INV2) coupled to the first inverter (INV1), the second inverter having a second inverter input and a second inverter output, the second inverter input coupled to the first inverter output;
a third inverter (INV3) coupled to the second inverter (INV2), the third inverter having a third inverter input and a third inverter output; and
a current device coupled to the first inverter output, the current device configured to provide a current at the first inverter output.

2. The D-type flip-flop of claim 1, wherein the current device is controlled by an output voltage (z) of the second inverter.

3. The D-type flip-flop of claim 1, wherein the pair of transistors in the first inverter (INV1) comprises a first P-type transistor (M9) and a first N-type transistor (M10), the current device comprises a second P-type transistor (M11), and a gate of the second P-type transistor (M11) is coupled to an output voltage (z) of the second inverter, a source of the second P-type transistor (M11) is coupled to system voltage, VDD, and a drain of the second P-type transistor (M11) is coupled to the second inverter input.

4. The D-type flip-flop of claim 1, wherein the current is configured to accelerate a rate at which the input voltage (x) diverges from the output voltage (y).

5. The D-type flip-flop of claim 3, wherein a current, $I_{M9}$, through the first P-type transistor (M9) plus a current, $I_{M11}$, through the second P-type transistor (M11) equals a current, $I_{M10}$, through the first N-type transistor (M10) when the D-type flip-flop is in a metastable condition.

6. The D-type flip-flop of claim 1, wherein the pair of transistors in the first inverter (INV1) comprises a first P-type transistor (M9) and a first N-type transistor (M10), the current device comprises a second P-type transistor (M11) and a second N-type transistor (M12).

7. The D-type flip-flop of claim 1, wherein the pair of transistors in the first inverter (INV1) comprises a first P-type transistor (M9) and a first N-type transistor (M10), the current device comprises a second P-type transistor (M11), a gate of the second P-type transistor (M11) is coupled to a fixed bias voltage, a source of the second P-type transistor (M11) is coupled to system voltage, VDD, and a drain of the second P-type transistor (M11) is coupled to the second inverter input.

8. The D-type flip-flop of claim 6, wherein a gate of the second P-type transistor (M11) is coupled to an output voltage (z) at the second inverter output, a source of the second P-type transistor (M11) is coupled to system voltage, VDD, and a drain of the second P-type transistor (M11) is coupled to the second inverter input; and a gate of the second N-type transistor (M12) is coupled to the output voltage (z) at the second inverter output, a drain of the second N-type transistor (M12) is coupled to the second inverter input, and a source of the second N-type transistor (M12) is coupled to system ground.

9. The D-type flip-flop of claim 6, wherein a current, $I_{M9}$, through the first P-type transistor (M9) plus a current, $I_{M11}$, through the second P-type transistor (M11) equals a current, $I_{M10}$, through the first N-type transistor (M10) when the second P-type transistor (M11) is on and the D-type flip-flop is in a metastable condition, and a current, $I_{M10}$, through the first N-type transistor (M10) plus a current, $I_{M12}$, through the second N-type transistor (M12) equals a current, $I_{M9}$, through the first P-type transistor (M9) when the second N-type transistor (M12) is on, and the D-type flip-flop is in a metastable condition.

10. The D-type flip-flop of claim 1, wherein the third inverter input is coupled to the second inverter output, and the third inverter output provides an output of the DFF.

11. The D-type flip-flop of claim 1, further comprising a fourth inverter (INV4) having a fourth inverter input and a fourth inverter output, wherein the third inverter input is coupled to the second inverter input, the fourth inverter input is coupled to the third inverter output, and the fourth inverter output provides the output of the DFF.

12. A method for operating a D-type flip-flop (DFF), comprising:
receiving an input voltage (x) at a first inverter input and generating an output voltage (y) at a first inverter output;
beginning voltage transition of the input voltage (x) and the output voltage (y) to opposite logic states; and
increasing a rate of the voltage transition of the input voltage (x) and the output voltage (y).

13. The method of claim 12, wherein increasing the rate of the voltage transition of the input voltage (x) and the output voltage (y) occurs when the D-type flip-flop is in a metastable state.

14. The method of claim 12, comprising increasing a rate of the voltage transition of the input voltage (x) and the output voltage (y) by adding current to a node associated with the output voltage (y) thereby increasing a voltage of the input voltage (x) relative to the output voltage (y).

15. The method of claim 12, further comprising controlling the rate of increase of the voltage transition of the input voltage (x) and the output voltage (y) using a fixed bias voltage.

16. The method of claim 12, further comprising:
providing the output voltage (y) to a second inverter input;
generating a second inverter output voltage (z) at a second inverter output; and
controlling the rate of increase of the voltage transition of the input voltage (x) and the output voltage (y) using the second inverter output voltage (z).

17. An analog-to-digital converter (ADC), comprising:
a loop filter configured to receive an input signal and provide an output signal;
a quantizer coupled to the loop filter, the quantizer configured to receive an output of the loop filter and provide an output signal;
a digital-to-analog converter (DAC) configured to receive an output of the quantizer and provide an output to the loop filter;
the quantizer comprising a zero crossing detector (ZCD) and a time-to-digital converter (TDC), the time-to-digital converter (TDC) comprising a plurality of D-type flip-flops, each D-type flip-flop configured to receive a data signal and a clock signal, each D-type flip-flop comprising:
an input circuit having a plurality of transistors configured to receive a clock signal and a data signal, the input circuit coupled to a first node and configured to output a first signal at the first node;
a plurality of inverters, wherein an input of a first inverter of the plurality of inverters is coupled to the first node; and
a transistor, the transistor having a source and a drain, the source coupled to a reference voltage, the drain coupled to a second node, the second node coupling an output of the first inverter to an input of a second inverter of the plurality of inverters.

18. The analog-to-digital converter (ADC) of claim 17, wherein a gate of the transistor is coupled to an output of the second inverter.

19. The analog-to-digital converter (ADC) of claim 17, wherein the transistor further has a gate, wherein the reference voltage comprises a system voltage, and wherein each D-type flip-flop further comprises a second transistor having a source, a drain, and a gate, the source of the second transistor coupled to ground, the drain of the second transistor coupled to the second node, and the gates of the first and second transistor couped to an output of the second inverter.

20. The analog-to-digital converter (ADC) of claim 17, wherein a gate of the transistor is coupled to a fixed bias voltage.

* * * * *